(12) United States Patent
Grama et al.

(10) Patent No.: US 7,800,281 B1
(45) Date of Patent: Sep. 21, 2010

(54) ACOUSTIC WAVE FILTERS USING PHOTO-DEFINABLE EPOXY FOR SUPPRESSION OF UNWANTED ACOUSTIC ENERGY

(75) Inventors: George Grama, Sanford, FL (US); Suzanne Combe, Longwood, FL (US); Rodolfo Chang, Longwood, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 112 days.

(21) Appl. No.: 12/277,415

(22) Filed: Nov. 25, 2008

(51) Int. Cl.
*H01L 41/08* (2006.01)
(52) U.S. Cl. .................................. 310/313 D; 310/313 A
(58) Field of Classification Search ............. 310/313 A, 310/313 R, 313 D
See application file for complete search history.

(56) References Cited

U.S. PATENT DOCUMENTS

| | | | | |
|---|---|---|---|---|
| 4,090,153 A | * | 5/1978 | Toda et al. ................... | 333/151 |
| 4,354,129 A | * | 10/1982 | Ieki ......................... | 310/313 C |
| 4,470,026 A | | 9/1984 | Buckinx et al. | |
| 4,472,694 A | * | 9/1984 | Lee .............................. | 333/194 |
| 4,510,410 A | * | 4/1985 | Yuhara et al. ........... | 310/313 D |
| 4,516,095 A | * | 5/1985 | Lee .............................. | 333/194 |
| 4,931,752 A | * | 6/1990 | Bray et al. .................. | 333/151 |
| 5,173,667 A | * | 12/1992 | Meitzler ..................... | 333/143 |
| 2003/0127943 A1 | * | 7/2003 | Tsuzuki et al. .......... | 310/313 R |

* cited by examiner

*Primary Examiner*—Mark Budd
(74) *Attorney, Agent, or Firm*—Allen, Dyer, Doppelt, Milbrath & Gilchrist, P.A.

(57) ABSTRACT

A SAW filter comprising an input transducer and an output transducer fabricated on a piezoelectric substrate and an epoxy based photo-definable acoustic absorber on the substrate for suppressing unwanted acoustic waves. The photo-definable acoustic absorber has a viscosity in a range from about 50 centistokes to 12000 centistokes and a thickness from about 10 microns to 120 microns. One acoustic absorber includes an SU-8 family member epoxy.

11 Claims, 5 Drawing Sheets

ACOUSTIC WAVE FILTERS USING PHOTO-DEFINABLE EPOXY FOR SUPPRESSION OF UNWANTED ACOUSTIC ENERGY

FIELD OF INVENTION

The present invention generally relates to the field of acoustic wave devices using piezoelectric substrates, and more particularly to an acoustic wave device employing acoustic absorbers for suppression of unwanted acoustic energy.

BACKGROUND

It is a well recognized practice to apply some sort of acoustic absorber material at the ends of the piezoelectric surface and also on certain portions of the metal transducers as well as the multi-strip coupler of a surface acoustic wave (SAW) filter, by way of example. By absorbing undesired modes of the SAW, both the frequency response of the filter as well as side lobes and the rejection of various time spurious responses such as edge reflections may be significantly enhanced.

Typically, SAW device manufacturers use a family of rubber materials known as room temperature vulcanizing (RTV) epoxies or resins applied in either manual or automatic fashion for the suppression of unwanted acoustic energy, such acoustic waves that reflect off chip edges. This type of material has been proven to be very effective for such application due to its high absorption qualities and stable temperature performance capabilities. One major drawback of RTV is that the method of application wherein material is typically forced out through a syringe is very coarse, thus not allowing designers to lay out a precise or specific acoustically desirable pattern. Another method for a high volume and low cost technique of applying an acoustic absorber to SAW devices is the use of a solder mask printed circuit board (PCB) screen printing technique. The absorber material is similar to the one used for solder mask for PCB screen printing.

By way of example, FIG. 1a illustrates one screened absorber SAW device having input and output transducers and a multistrip coupler for coupling energy between the transducers The absorber material is applied using a stainless steel screen mask used to "print" the desired absorber pattern just before the cutting of wafers. This steel mask becomes part of the design process and therefore the shape of its pattern needs to be precise and contingent on each filter specification. Also, it has the additional advantage of allowing accurate measurement of the filter response at the wafer probe level. However, this method has several disadvantages. By way of example, the absorber material "bleeds out" as illustrated with reference to FIGS. 1b and 1c. The material tends to expand after curing by 100 to 160 microns in all directions along the surface. Therefore, the active "real estate area" is effectively reduced for the active transducers. As a result, it becomes very difficult to design high performance intermediate frequency (IF) filters on packages smaller than 5×5 mm. Further, the performance of this absorber material at cold temperature is inadequate for several filters with low error vector magnitude (EVM) as has been reported by device users and design engineers. The lack of performance is due to the fact that this material becomes stiff and rigid at cold temperature. It reflects, instead of dampening, the waves back to the transducers thus distorting the pass band filter response and degrading its EVM.

Yet further, the typical absorber application method is not compatible with a standard semiconductor photolithography process. The current screen printing method increases overall wafer level manufacturing costs because of the requirement that an operator be employed to manually align the absorber mask with the patterned wafers. In addition, the normal process is disrupts the normal process flow which needs to be streamlined to avoid all possible manufacturing mistakes.

Typical methods making use of polymers that can be photo-definable suffer from poor absorption of acoustic wave energy and thus have limited usage. As the typical polymer thickness achievable is several microns, the use of polymers will generally require a multilayered fabrication process.

The present invention provides a measured improvement in performance of an epoxy based photo definable acoustic absorber when compared to current screen printing processes and provides desirable advantages over well known photo definable methods and RTV type materials. The present invention desirably eliminates or mitigates the above described drawbacks and retains excellent absorption qualities when compared to RTV.

SUMMARY OF THE INVENTION

According to the teachings of the present invention, a SAW filter may comprise a transducer pattern on a surface of a piezoelectric substrate and an epoxy based photo-definable epoxy on the substrate for suppressing unwanted acoustic waves. A SAW device according to the present invention may further comprise an input transducer and an output transducer fabricated on a piezoelectric substrate and an epoxy based photo-definable acoustic absorber carried on the transducers or on the transducers and the surface of the substrate. The photo-definable epoxy absorber may have a viscosity in the range of 50 to 12000 centistokes (cSt). A thickness of the epoxy may range from 10 microns to 120 microns. One embodiment of the photo-definable epoxy absorber may comprise an SU-8 family member epoxy.

The teachings of the present invention provide a new way of applying an epoxy based photo-definable photo resist for providing an acoustic absorption of unwanted reflections present on the surface of a piezoelectric substrate. A photo imageable epoxy is used as an absorber and has been shown to provide desirable transmission capability as a screen absorber. In addition, remarkable performance improvement over typical screen absorbers in terms of its reflection capability, specifically over a cold temperature range have been experienced. As a result, an Error Vector Magnitude (EVM) of an IF filter is improved at cold temperatures, thus improving fidelity of a radio receiver for digital based communication systems, by way of example. The photo definable absorber according to the teachings of the present invention is further compatible with a standard semiconductor photolithography process allowing the process flow to be streamlined and decreasing the overall cost.

BRIEF DESCRIPTION OF DRAWINGS

Embodiments of the invention are described, by way of example with reference to the accompanying drawings in which.

DETAILED DESCRIPTION OF THE PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1A:
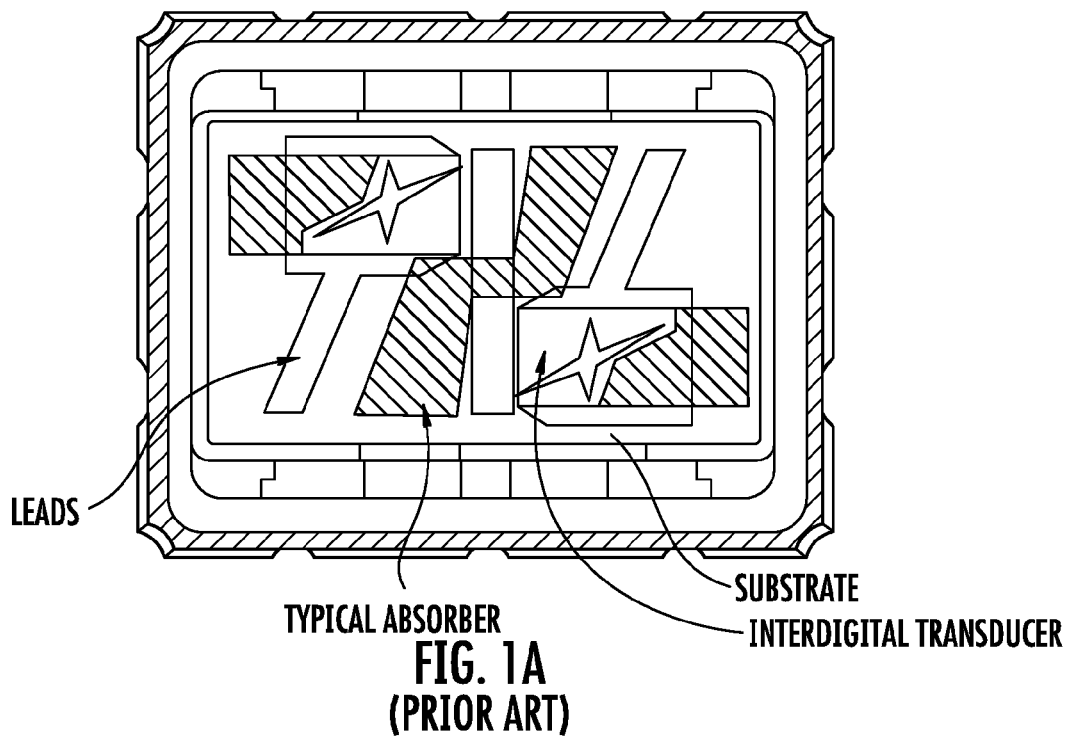
FIG. 1a illustrates a known SAW device with a screened absorber using a stainless steel screened mask.
Figure 1B:
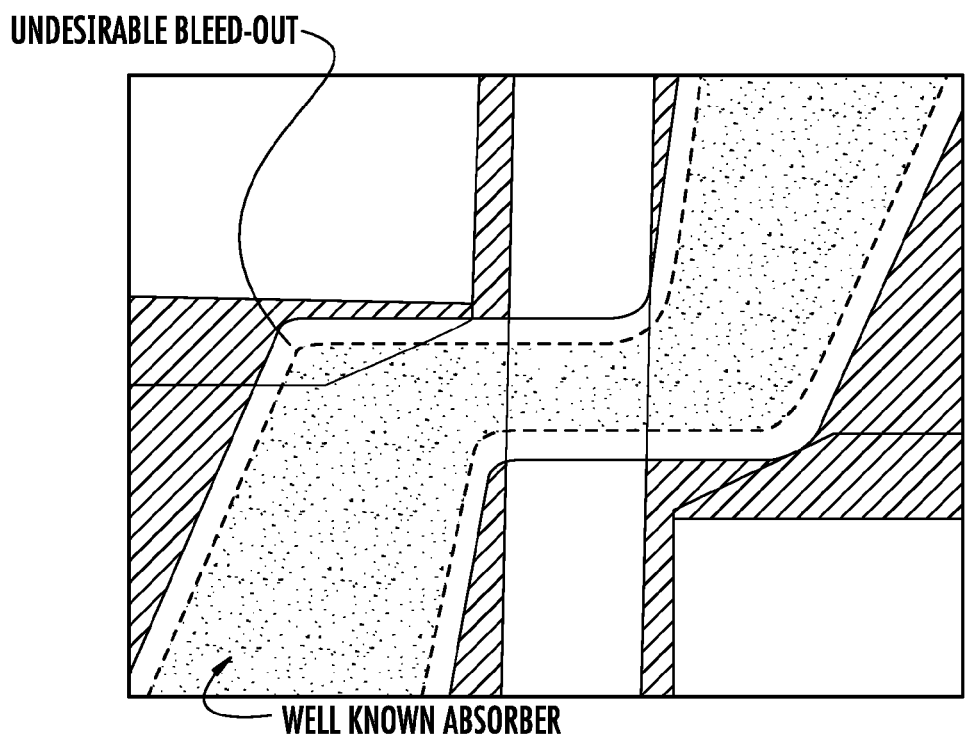
FIG. 1b illustrates the screened absorber having an undesirable bleed out condition, such bleed out condition resulting in a covering of coupler strips thus inhibiting filter performance.
Figure 2:
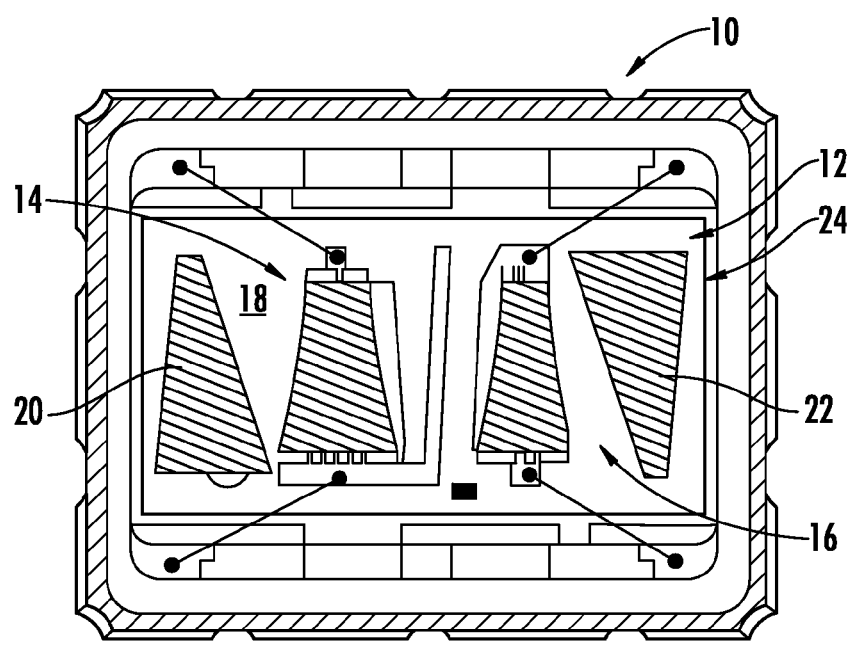
FIG. 2 illustrates a SAW filter with a photo-definable epoxy absorber according to the teachings of the present invention.

With reference now to FIG. 2, one embodiment of the present invention comprises a SAW filter 10 comprising a substrate 12 and input and output transducers 14, 16 on a surface 18 of the substrate. For the embodiment herein described by way of example with reference to FIG. 2, an epoxy based photo-definable absorber material 20, 22 is carried on the surface 18 at opposing ends of the transducers 14, 16. The epoxy based photo-definable absorber material 20, 22 is herein defined for an absorber of an epoxy based photoresist in which pattern geometries of the photoresist may be defined by fabrication processes using a photomask.

By way of example, the SAW filter 10 is fabricated on a piezoelectric substrate 12 of a 128° rotated Y-cut LiNbO3 and has a fractional bandwidth greater than 8%. Other piezoelectric substrates including various cuts of Lithium Niobate, Lithium Tantalate, Lanthanum Gallium Silicate (Langasite) and Quartz may be used. In a conventional SAW IF filter, a transducer can launch acoustic energy in both directions. Some of the energy may be reflected at the end of the chip 24 causing spurious responses which may degrade the passband performance in terms of group delay variation and amplitude ripple. A large fractional bandwidth SAW filter is herein chosen by way of example because of its passband performance, in particular amplitude ripple, phase and group delay variation from linearity, is most affected by strong end reflections. The amount of end reflections is inversely proportional to the amount of acoustic absorption. Thus, the SAW filter passband performance can be used to characterize the effectiveness of the acoustic absorber. The photo-definable absorber material 20, 22 belongs to the family of SU-8 which is a high contrast epoxy based negative tone photoresist. It enables thick film coatings capable of patterning features with high aspect ratios, over 5:1 by way of example. The chosen formulation is ideally suited for applications where the resulting image remains part of the finished device.

In one method of the invention, the SU 8 of the required formulation may be spun coated onto the wafer surface and will be baked precisely. The latent image may be formed through i-line exposure of the negative tone pattern where cross linking of the SU 8 chemical occurs in two stages including: 1) During exposure a photo acid compound is formed, and 2) Post exposure baking of the exposed wafer completes the acid catalyzed, thermally driven epoxy cross linking. The final pattern may be developed using a suitable solvent based developed solution.

Figure 3A:
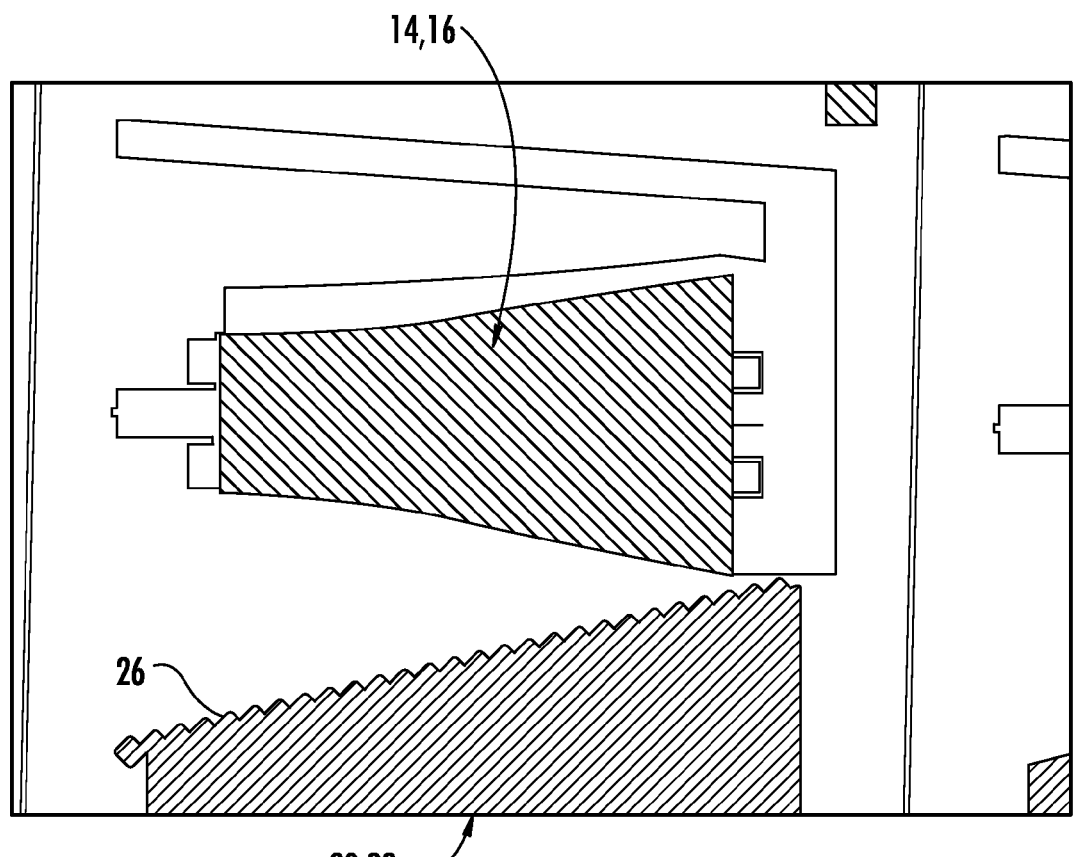
FIG. 3a is a partial top plan view of the SAW filter of FIG. 2 using an SU-8 absorber material having a 30 μm thickness.

By way of example, embodiments of SAW filters using SU-8 3010 and spun at 2500 rpm and 4000 rpm to a thickness of about 10 μm and 5 μm thickness, respectively, have been successfully built. In another embodiment, a SAW filter using SU-8 3025 and spun with varying speeds to obtain thicknesses ranging from 20 μm to 60 μm also showed success. FIG. 3a illustrates one embodiment of the present invention for a SAW filter with a photo-definable epoxy SU-8 having thicknesses 30 μm, by way of example. The viscosities of the various members of the SU-8 family ranging from 50 cSt to 12000 cSt allow for thickness variation from 5 μm to 120 μm with a single spin application.

Figure 3B:
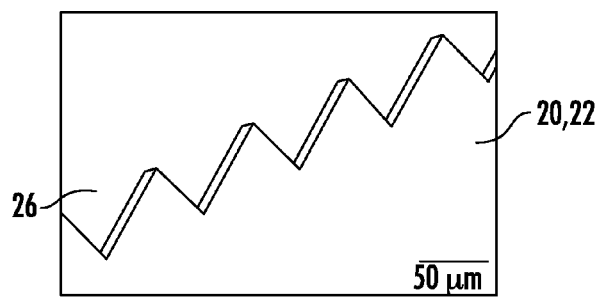
FIG. 3b is a partial view of a edge portion of the absorber of FIG. 3a from a scanning electron microscope (SEM) further illustrating one desirably well defined edge portion of the absorber according to the teachings of the present invention.

With continued reference to FIG. 3a and with reference to FIG. 3b, one desirable, well defined saw tooth edge 26 of the absorber 20, 22 may be formed, and alternatively well defined square wave, straight line or wavy edges may be formed with confidence to establish preselected absorber responses.

Figure 4A:
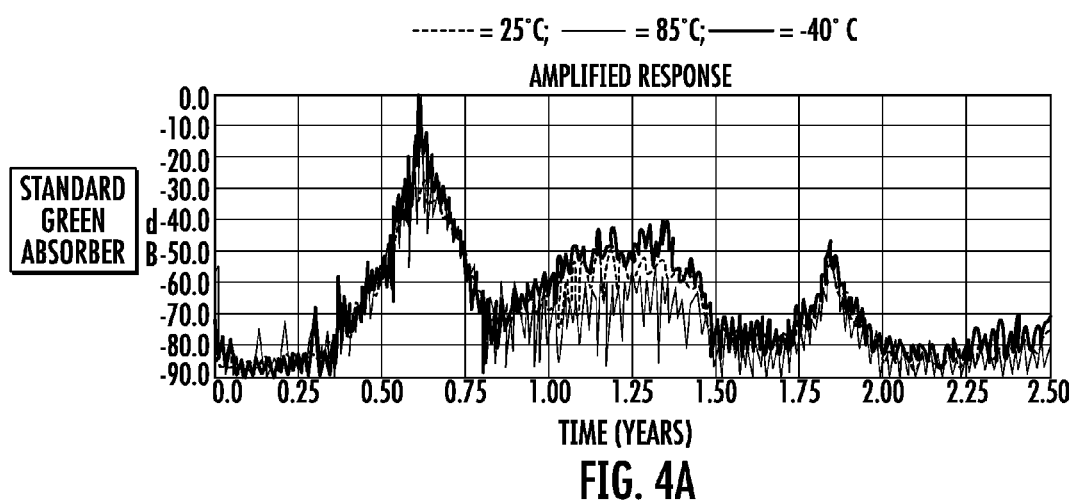
FIGS. 4a and 4b illustrate edge reflections in a time response for comparison between a standard screen absorber and the SU-8 absorber used in the filter of FIG. 2.
Figure 4B:
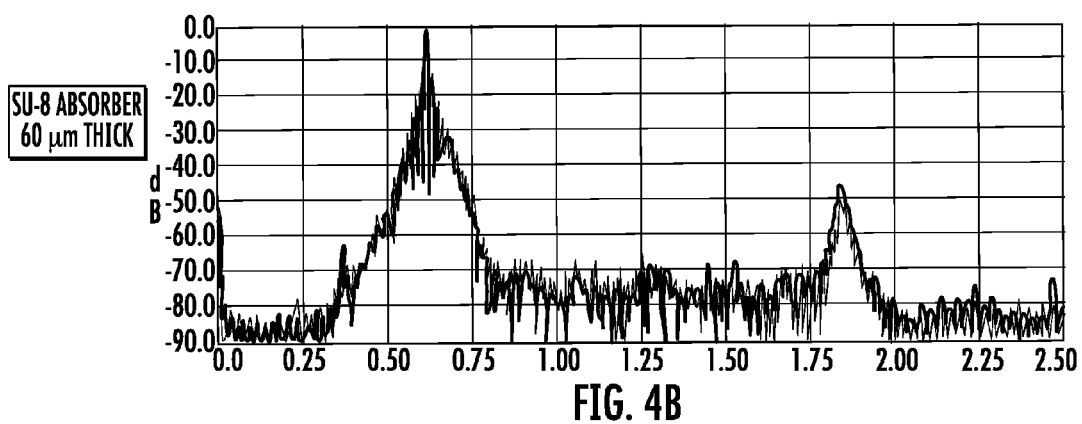

To illustrate a satisfaction of needs in the art, filter performance was compared to that of prior art screened absorber over the operating temperature range of −40° C. to 85° C. Spurious responses caused by acoustic waves reflected off the edge of the die or chip 24 can be observed in the time domain response of the SAW filter 10. As illustrated in FIGS. 4a and 4b around the time 1.25 μsec, the edge reflections of the prior art screened absorber is much more severe as compared to the SU-8 absorber with 60 um thickness. This condition is observed across all three temperatures.

Figure 5:
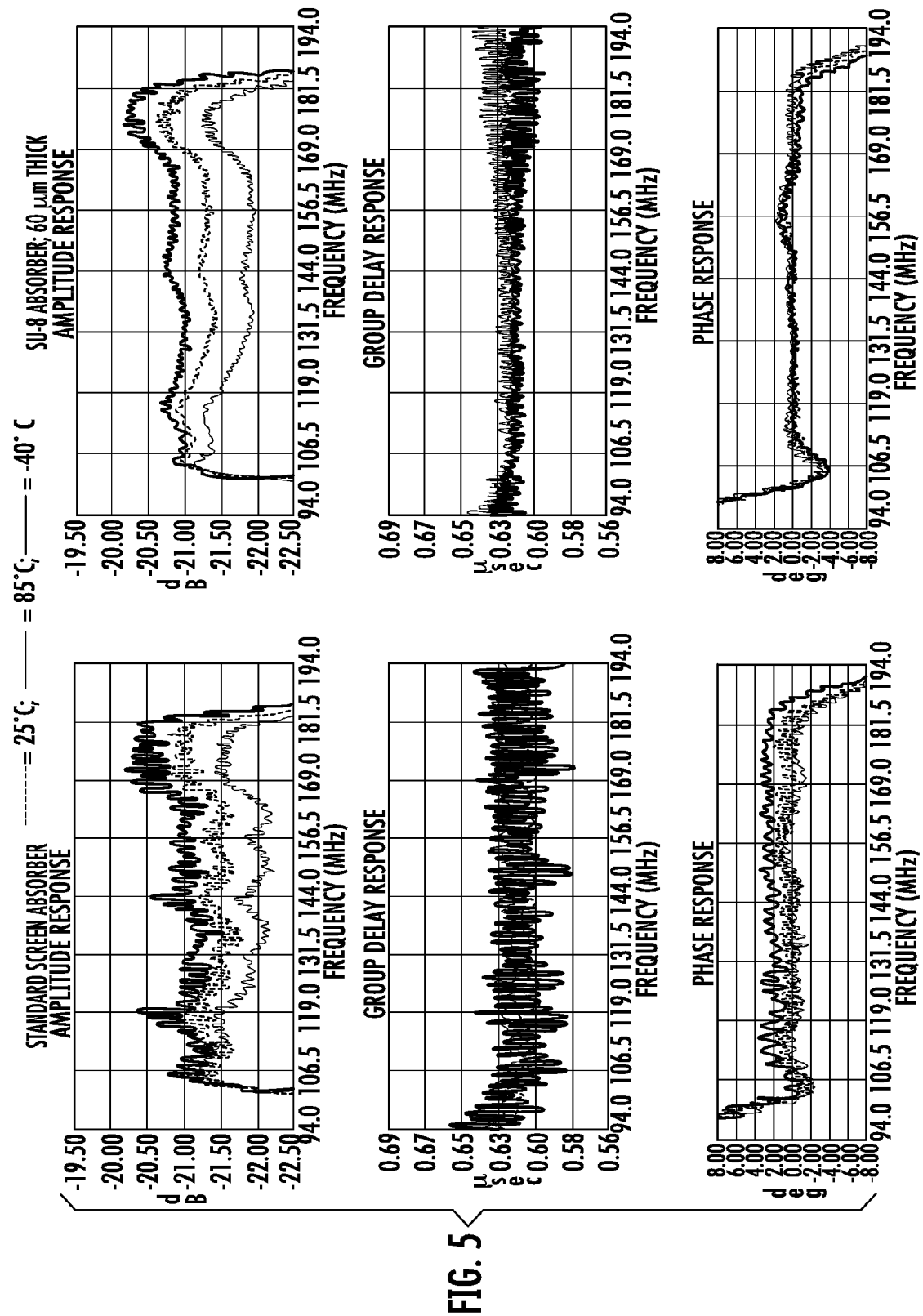
FIG. 5 illustrates amplitude, group delay and phase responses in plot form for a SAW device having an undesirable group delay and phase deviation from linearity for the standard screened absorber versus desirable responses for the SU-8 absorber.
Figure 6:
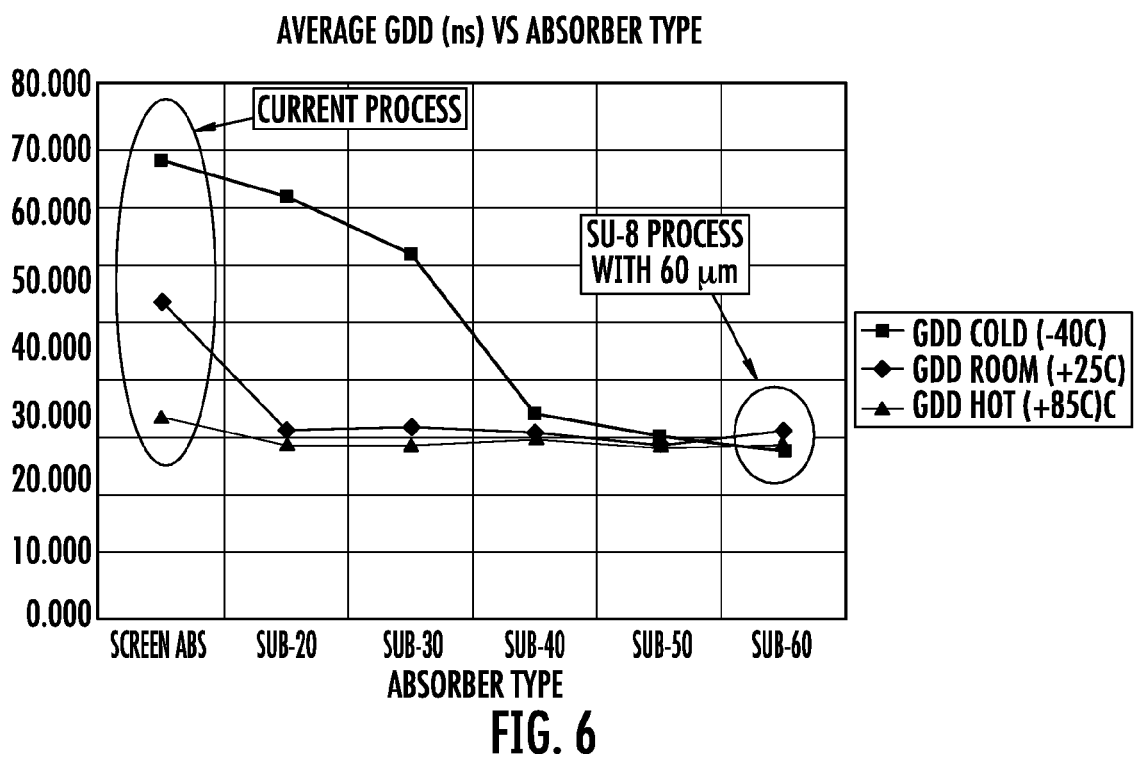
FIG. 6 illustrates an average group delay deviation (GDD) for a device having the SU-8 absorber for different thicknesses of screened absorbers.

As above described, Error Vector Magnitude (EVM) is an important parameter that is used to characterize the fidelity of radio receiver for cellular communication systems. The lower EVM can be achieved by designing a filter with improved phase and group delay linearity along with low amplitude variation. This phenomenon may be achieved if the spurious response caused by reflection off the edge of the die chip can be suppressed adequately. With reference to FIG. 5, plots of amplitude variation along with phase and group delay variation for the three temperature data are illustrated by way of example. Again it can be clearly seen that the SU8 absorber shows significant improvement over the prior art screened absorber. FIG. 6 illustrates average group delay variations from linearity with SU-8 with thicknesses from 20 microns to 60 microns as compared to a screened absorber. The average group delay variation for SU-8 with 60 μm shows less than 30 ns as compared to 70 ns of the screened absorber.

While SU-8 is herein described by way of example for use in embodiments of the invention, it is interesting to note SU-8 material has long been used in the MEMS industry for its versatility in mechanical properties that allow it to be used in a wide variety of applications as a permanent part of the device structure. Within the MEMS arena, the three largest markets have been in Microfluidics, Advanced Packaging and Optoelectronics. SU-8's ability to resist a wide range of chemistries makes it an ideal material for Microfluidics where strong mechanical properties are required with large aspect ratio precision fabrication. Typical end products for this industry could include inkjet heads and various arrays for biological analysis. SU-8 has also become very popular in the advanced packaging world as a low cost of encapsulation material for various wafer level packaging concepts. In addition, the optical properties of SU-8 have made it an attractive option for use in optical wave guides, cantilevers in Atomic Force Microscopes and micro-mirror arrays.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed:

1. A SAW filter comprising;
   a piezoelectric substrate;
   an input transducer and an output transducer on a surface of the piezoelectric substrate; and
   an epoxy based photo-definable acoustic absorber carried on the surface of the piezoelectric substrate, the photo-definable acoustic absorber absorbing acoustic waves during operation of the filter, wherein the photo-definable acoustic absorber has a viscosity in a range from about 50 centistokes to 12000 centistokes.

2. A SAW filter according to claim 1, wherein the photo-definable acoustic absorber comprises an epoxy having a thickness in a range from about 10 microns to 120 microns.

3. A SAW filter according to claim 1, wherein the photo-definable acoustic absorber covers at least a portion of at least one of the input and the output transducers.

4. A SAW filter according to claim 1, wherein the photo-definable acoustic absorber covers a portion of the surface of the piezoelectric substrate proximate the input and the output transducers.

5. A SAW filter according to claim 1, wherein the photo-definable absorber comprises an SU-8 family member epoxy.

6. A SAW filter according to claim 1, wherein the photo-definable acoustic absorber comprises an epoxy based photoresist material.

7. A SAW filter according to claim 6, wherein pattern geometries of the photoresist material are defined by fabrication processes using a photomask.

8. A SAW filter according to claim 6, wherein an edge portion of the photo-definable acoustic absorber comprises a saw tooth pattern.

9. A SAW filter according claim 1, wherein the piezoelectric substrate is selected from a group consisting of Lithium Niobate, Lithium Tantalate, Lanthanum Gallium Silicate and Quartz.

10. A SAW filter according to claim 1, wherein the photo-definable acoustic absorber comprises a high contrast epoxy based, negative tone photoresist material.

11. A SAW filter according to claim 1, wherein the photo-definable acoustic absorber comprises a film coating having patterning features with an aspect ratio of at least five to one.

* * * * *